US010287707B2

(12) United States Patent
Ishikawa et al.

(10) Patent No.: US 10,287,707 B2
(45) Date of Patent: May 14, 2019

(54) FILM GROWTH APPARATUS, FILM GROWTH METHOD AND MAINTENANCE METHOD OF FILM GROWTH APPARATUS

(71) Applicant: NuFlare Technology, Inc., Kanagawa (JP)

(72) Inventors: Yoshitaka Ishikawa, Yokohama (JP); Hideshi Takahashi, Yokohama (JP)

(73) Assignee: NuFlare Technology, Inc., Kanagawa (JP)

( * ) Notice: Subject to any disclaimer, the term of this patent is extended or adjusted under 35 U.S.C. 154(b) by 0 days.

(21) Appl. No.: 15/711,281

(22) Filed: Sep. 21, 2017

(65) Prior Publication Data

US 2018/0087182 A1 Mar. 29, 2018

(30) Foreign Application Priority Data

Sep. 26, 2016 (JP) .................................. 2016-186687

(51) Int. Cl.
| | | |
|---|---|---|
| C23C 16/30 | (2006.01) | |
| C30B 25/14 | (2006.01) | |
| C23C 16/44 | (2006.01) | |
| C23C 16/455 | (2006.01) | |
| C23C 16/458 | (2006.01) | |
| C30B 25/08 | (2006.01) | |
| C30B 29/40 | (2006.01) | |
| H01L 21/02 | (2006.01) | |

(52) U.S. Cl.
CPC .......... *C30B 25/14* (2013.01); *C23C 16/4401* (2013.01); *C23C 16/4404* (2013.01); *C23C 16/4412* (2013.01); *C23C 16/455* (2013.01); *C23C 16/458* (2013.01); *C23C 16/4586* (2013.01); *C30B 25/08* (2013.01); *C30B 29/403* (2013.01); *H01L 21/0262* (2013.01)

(58) Field of Classification Search
CPC ......... C23C 16/30; C23C 16/52; C30B 25/16; C30B 25/14
See application file for complete search history.

(56) References Cited

U.S. PATENT DOCUMENTS

| 5,611,863 | A | 3/1997 | Miyagi | |
|---|---|---|---|---|
| 2010/0093111 | A1* | 4/2010 | Inoue | ..................... C23C 16/52 438/5 |
| 2011/0204492 | A1* | 8/2011 | Xie | ......................... C23C 16/30 257/635 |

FOREIGN PATENT DOCUMENTS

JP 8-64578 3/1996

\* cited by examiner

*Primary Examiner* — Robert M Kunemund
(74) *Attorney, Agent, or Firm* — Rankin, Hill & Clark LLP

(57) ABSTRACT

A film growth apparatus according to one aspect of the present disclosure includes: a reactor configured to perform film growth processing on a substrate; an exhaust configured to discharge an exhaust gas from the reactor to the outside; a first valve including a valving element, the first valve provided in a pipe connecting the reactor with the exhaust and configured to control a pressure of the reactor by a position of the valving element; a valving element driver configured to cause the valving element to operate; and a valve controller including a closed position storage configured to store a closed position of the valving element, an opening degree controller configured to control the position of the valving element operated by the valving element driver, and a closed position shifter configured to detect a load of the valving element driver and shift the closed position in a case where the load exceeds a predetermined reference value.

13 Claims, 7 Drawing Sheets

PROCESS GAS

OPENING DEGREE 0%

PROCESS GAS

OPENING DEGREE 5%

PROCESS GAS

OPENING DEGREE 50%

PROCESS GAS

OPENING DEGREE 100%

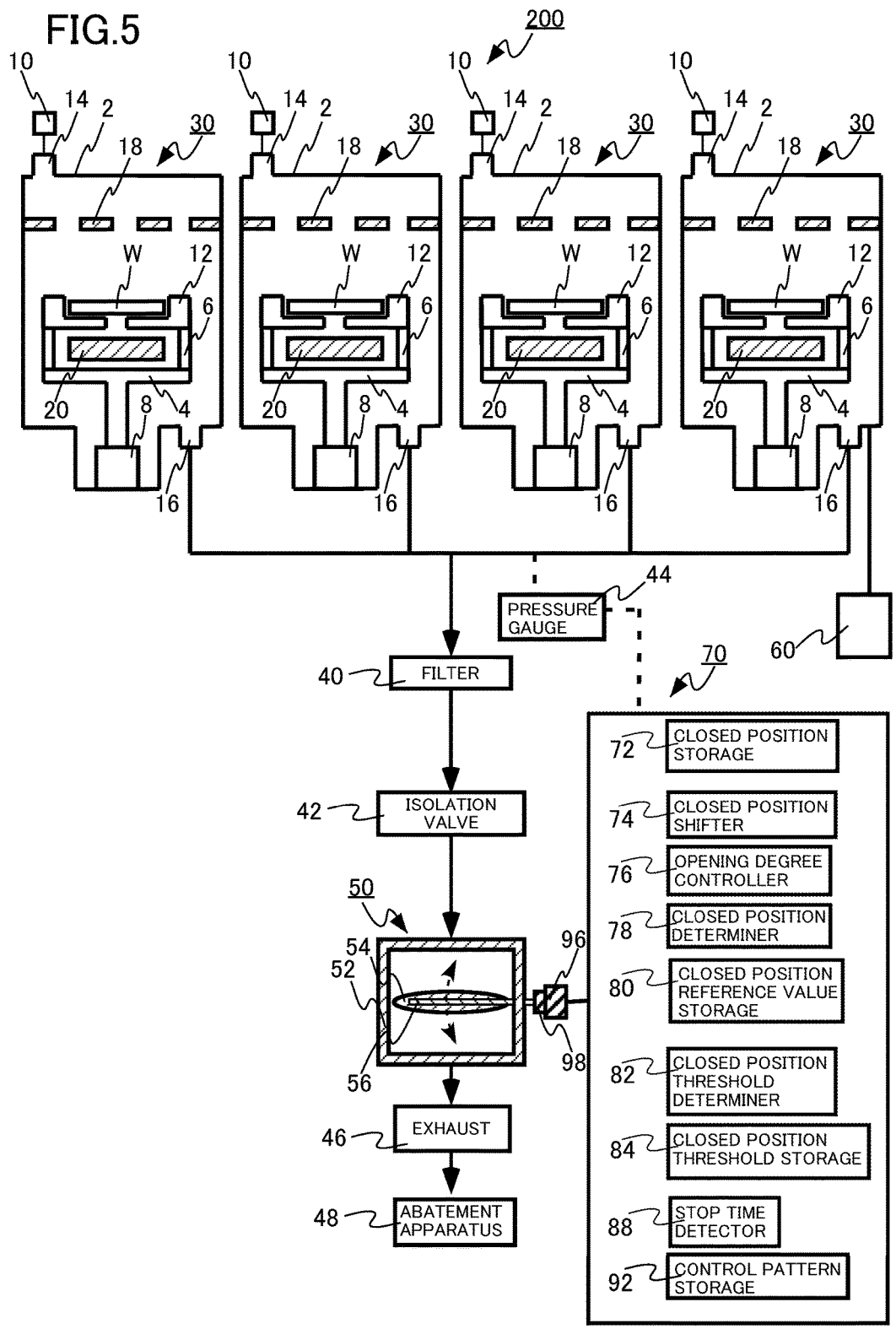

FILM GROWTH APPARATUS, FILM GROWTH METHOD AND MAINTENANCE METHOD OF FILM GROWTH APPARATUS

CROSS-REFERENCE TO RELATED APPLICATION

This application is based upon and claims the benefit of priority from Japanese Patent Applications No. 2016-186687, filed on Sep. 26, 2016, the entire contents of which are incorporated herein by reference.

FIELD OF THE INVENTION

Embodiments described herein relate generally to a film growth apparatus, a film growth method and a maintenance method of film growth apparatus.

BACKGROUND OF THE INVENTION

As a method for growing a high quality semiconductor film, there is an epitaxial growth technique in which a single crystal film is grown on a wafer (substrate) by vapor phase growth.

In the film growth method and the film growth apparatus using this epitaxial growth technique, the wafer is heated while being supported by a supporter in a reactor maintained under normal pressure or reduced pressure. Next, a reactant gas as a source of film formation is supplied onto the wafer. A thermal reaction, or the like, of the reactant gas occurs on the surface of the wafer, leading to formation of an epitaxial single crystal film.

In particular, exhaust gas after film formation by metal organic chemical vapor deposition (MOCVD) contains a large amount of reaction byproducts. These reaction byproducts are deposited inside a valve provided for pressure adjustment of the reactor and are turned into a residue. The residue causes biting between a valving element and a valve box, leading to a difficulty in operation of the valving element. This would produce a necessity of cleaning the valve, decreasing an availability of the film growth apparatus.

As described above, there is a problem of the decrease in availability of the film growth apparatus due to the residues caused by reaction byproducts. This problem becomes significant particularly by controlling a plurality of reactors to have a same condition and unifying an exhaust system in processing a plurality of wafers in parallel in order to increase throughput.

SUMMARY OF THE INVENTION

A film growth apparatus according to one aspect of the present disclosure includes: a reactor configured to perform film growth processing on a substrate; an exhaust configured to discharge an exhaust gas from the reactor to the outside; a first valve including a valving element, the first valve provided in a pipe connecting the reactor with the exhaust and configured to control a pressure of the reactor by a position of the valving element; a valving element driver configured to cause the valving element to operate; and a valve controller including a closed position storage configured to store a closed position of the valving element, an opening degree controller configured to control the position of the valving element operated by the valving element driver, and a closed position shifter configured to detect a load of the valving element driver and shift the closed position in a case where the load exceeds a predetermined reference value.

A film growth method according to one aspect of the present disclosure is a film growth method for performing film growth processing on a substrate by introducing a process gas at a predetermined flow rate into a reactor, the substrate is loaded in the reactor, and controlling the reactor to have a predetermined pressure by a position of a valving element of a valve provided downstream of the reactor, the film growth method including: storing a closed position of the valving element; detecting a load of a valving element driver configured to cause the valving element to operate; and shifting the closed position in a case where the load exceeds a predetermined reference value.

A maintenance method of a film growth apparatus according to one aspect of the present disclosure is a maintenance method of a film growth apparatus, the film growth apparatus including a reactor configured to perform film growth processing on a substrate, an exhaust configured to discharge an exhaust gas from the reactor to the outside, a first valve including a valving element, the first valve provided in a pipe connecting the reactor with the exhaust and configured to control a pressure of the reactor by a position of the valving element, a valving element driver configured to cause the valving element to operate, the maintenance method of the film growth apparatus including: storing a closed position of the valving element; detecting a load of a valving element driver configured to cause the valving element to operate; shifting the closed position in a case where the load exceeds a predetermined reference value; and cleaning the valve in a case where the closed position exceeds a predetermined threshold.

BRIEF DESCRIPTION OF THE DRAWINGS

FIG. 5 is a schematic diagram of a film growth apparatus according to a third embodiment;

DETAILED DESCRIPTION OF THE EMBODIMENTS

First Embodiment

A film growth apparatus according to the present embodiment includes: a reactor configured to perform film growth processing on a substrate; an exhaust configured to discharge an exhaust gas from the reactor to the outside; a first valve including a valving element, the first valve provided in a pipe connecting the reactor with the exhaust and configured to control a pressure of the reactor by a position of the valving element; a valving element driver configured to cause the valving element to operate; and a valve controller including a closed position storage configured to store a closed position of the valving element, an opening degree controller configured to control the position of the valving element operated by the valving element driver, and a closed position shifter configured to detect a load of the valving element driver and shift the closed position in a case where the load exceeds a predetermined reference value.

Figure 1:
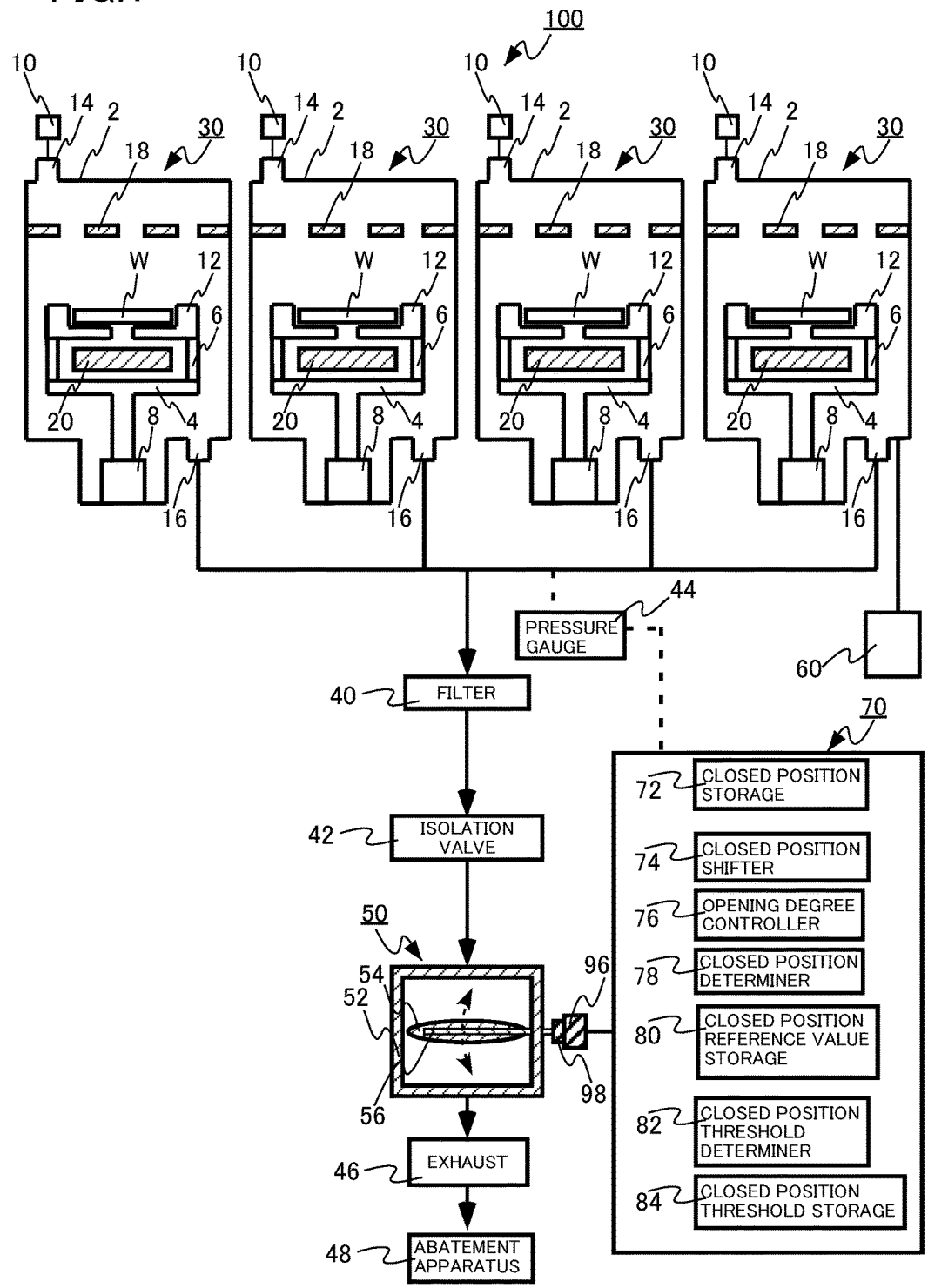
FIG. 1 is a schematic diagram of a film growth apparatus according to a first embodiment.

FIG. 1 is a schematic diagram of a film growth apparatus 100 according to the present embodiment.

The film growth apparatus 100 includes a film former 30, a filter 40, an isolation valve (second valve) 42, a pressure gauge 44, an exhaust 46, a scrubber 48, a valve (first valve) 50 and a control mechanism 60. The control mechanism 60 includes a valve controller 70, a valving element driver 96, and an opening degree sensor 98.

The film former 30 includes a reactor 2, a rotation base 4, a rotation ring 6, a rotation mechanism 8, a gas supply mechanism 10, a supporter 12, a gas supply port 14, an exhaust port 16, a shower plate 18, and a heater 20.

The valve controller 70 includes a closed position storage 72, a closed position shifter 74, an opening degree controller 76, a closed position determiner 78, a closed position reference value storage 80, a closed position threshold determiner 82, and a closed position threshold storage 84.

The film growth apparatus 100 according to the present embodiment is, for example, a vertical single wafer type epitaxial growth apparatus using a metal organic chemical vapor deposition (MOCVD) method. The epitaxial growth apparatus according to the present the embodiment grows on a wafer (substrate) W a single crystal film of a group III-V nitride based semiconductor such as gallium nitride (GaN), aluminum nitride (AlN), aluminum gallium nitride (AlGaN), indium gallium nitride (InGaN).

The growth of the film is performed in the reactor 2.

In the reactor 2, there is provided the supporter 12 on which the wafer W can be mounted. The supporter 12 rotates the wafer W in the circumferential direction of the wafer W. An exemplary wafer W is a silicon (Si) wafer and a sapphire wafer. An exemplary supporter 12 to be used is a holder having an opening at the center and supporting the substrate at the periphery. Alternatively, a susceptor without an opening may also be used as the supporter 12.

The supporter 12 includes a push up pin (not illustrated) for attaching and detaching the wafer W from the supporter 12, for example.

The supporter 12 is provided on the rotation ring 6. The rotation ring 6 is connected to the rotation mechanism 8 via the rotation base 4. An exemplary rotation mechanism is a motor.

The heater 20 is provided inside the rotation ring 6. The heater 20 generates heat by the power supplied from an external power source (not illustrated). With this configuration, the heater 20 heats the wafer W from the back surface. An example of the heater 20 is a known resistance heater.

The film former 30 individually includes a substrate loading-unloading port (not illustrated). The substrate loading-unloading port is used for loading the wafer W into the individual reactor 2 and for unloading the wafer W to the outside of the individual reactor 2.

For loading and unloading the wafer W, a robot hand (not illustrated) is used, for example. The wafer W loaded using the robot hand is supported by the supporter 12 inside the reactor 2. Note that the method of loading and unloading the wafer W is not limited to this.

The gas supply mechanism 10 supplies process gas into the reactor 2. The gas supply mechanism 10 includes a gas generator, a gas cylinder, a pipe, and a flow rate control device such as a regulating valve and a mass flow controller (not illustrated).

Examples of the process gas to be used include trimethylgallium (TMG), trimethylindium (TMI), trimethylaluminum (TMA), ammonia ($NH_3$) gas, nitrogen ($N_2$) gas, hydrogen ($H_2$) gas.

The reactor 2 includes a gas supply port 14 and an exhaust port 16. The process gas is supplied from the gas supply port 14 into the reactor 2. The supplied process gas passes through the shower plate 18 and is supplied onto the wafer W and used for film formation. The excess process gas and the reaction byproducts generated by the film formation are discharged from the exhaust port 16.

There are four reactors 2 described in FIG. 1. The number of reactors 2, however, is not limited to this.

The pressure gauge 44 is connected to the exhaust port 16 of the reactor 2. The pressure gauge 44 measures the pressure inside the reactor 2.

The exhaust 46 is connected to the exhaust port 16. The exhaust 46 discharges excess process gas and reaction byproducts from the exhaust port 16. An example of the exhaust 46 is an exhaust system including a known dry pump and a pressure gauge.

The scrubber 48 is connected to the exhaust 46. The scrubber detoxifies toxic gases and combustible gases discharged from the reactor 2. An example of the scrubber 48 is a known scrubber.

The valve 50 is connected to the exhaust port 16 and the exhaust 46. The valve 50 controls, using operation of a valving element 54, the flow rate of the process gas exhausted from the exhaust port 16 by the exhaust 46.

The filter 40 is connected to the exhaust port 16 and the valve 50. The filter 40 removes a portion of reaction byproducts discharged from the exhaust port 16.

The isolation valve 42 is connected to the filter 40 and the valve 50. The isolation valve 42 is provided for separating the reactor 2 from the valve 50, the exhaust 46, and the scrubber 48. The isolation valve 42 prevents the interior of the valve 50 and the interior of the exhaust 46 from being opened to the atmosphere when the interior of the reactor 2 is opened to the atmosphere for maintenance of the reactor 2. An example of the isolation valve 42 is a commercially available ball valve.

Note that the film growth apparatus 100 according to the present embodiment is not limited to a vertical single wafer type epitaxial growth apparatus using the MOCVD method. The film growth apparatus 100 may be a sputtering apparatus, a plasma CVD apparatus, a molecular beam epitaxy (MBE) apparatus, for example.

FIGS. 2A to 2D are schematic diagrams illustrating relationships between the opening degree of the valve 50 and the position of the valving element 54. The valve 50 illustrated in FIGS. 2A to 2D includes a valve box 52, the valving element 54, and a valve rod 56. The valve 50 of the present embodiment is a butterfly valve.

An example of the valve box 52 is an SUS-standard tube having a circular cross section. A main shaft of the above-described tube is 52a. The process gas passes through the inside of the valve box 52. An isolation valve 42 is connected to an inlet port 58a of the tube and an exhaust 46 is connected to an outlet port 58b of the tube.

The valving element 54 is provided inside the valve box 52. An example of the valving element 54 is a disk conforming to SUS standard and having a circular surface 54a. The valving element 54 is rotatable in the valve box 52.

The pressure inside the reactor 2 is adjustable by the rotation of the valving element 54 or the position of the valving element 54.

The valve rod 56 is a rod having one end being connected to the valving element 54 and the other end being provided outside the valve box 52. Rotating the other end of the valve rod 56 causes the valving element 54 to rotate. With this configuration, the position of the valving element 54 can be adjusted.

Residue Re is derived from the process gas. As described above, when the exhaust gas passes through the filter 40, a portion of the reaction byproducts is removed. Some of the reaction byproducts that have not been removed are deposited on an inner wall of the valve box 52, the surface 54a of the valving element, or the surface of the valve rod 56, and become the residue Re.

The flow of the process gas is hindered by the valving element 54 and the residue Re.

Figure 2A:
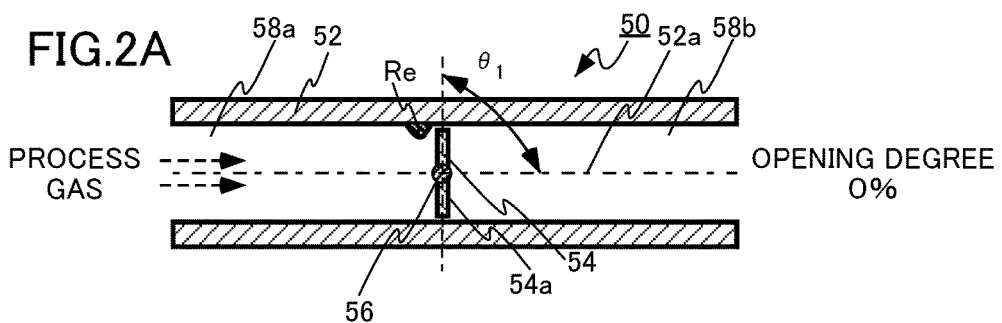
FIGS. 2A to 2D are schematic diagrams illustrating relationships between an opening degree of a valve and a valving element according to the first embodiment.

FIG. 2A illustrates a case where an angle $\theta_1$ between the valving element surface 54a and the main shaft 52a of the valve box is 90 degrees. In this case, the hindrance degree of the flow of the process gas inside the valve 50 is the highest.

For example, the opening degree of the valve 50 is defined by (90 degrees−θ)/90 degrees×100(%) using the angle θ between the surface 54a of the valving element and the main shaft 52a of the valve box. The opening degree of the valve 50 in FIG. 2A is 0%. The initial closed position of the valving element 54 is the position illustrated in FIG. 2A.

Figure 2B:
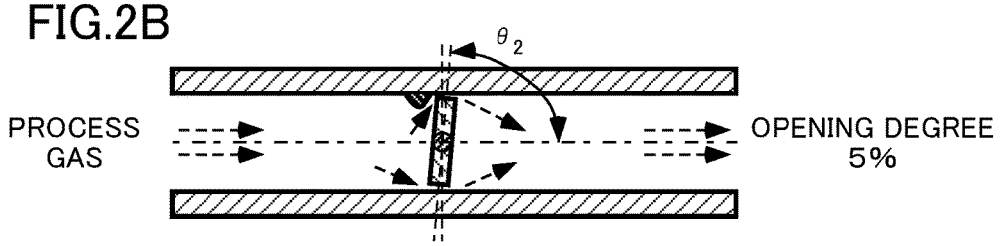

FIG. 2B illustrates a case where an angle $\theta_2$ between the surface 54a of the valving element and the main shaft 52a of the valve box is 85.5 degrees. In this case, the opening degree of the valve 50 is 5%.

Figure 2C:
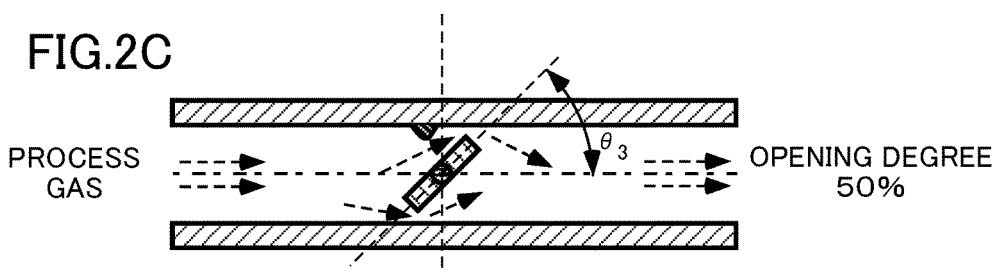

FIG. 2C illustrates a case where an angle $\theta_3$ between the surface 54a of the valving element and the main shaft 52a of the valve box is 45 degrees. In this case, the opening degree of the valve 50 is 50%.

Figure 2D:
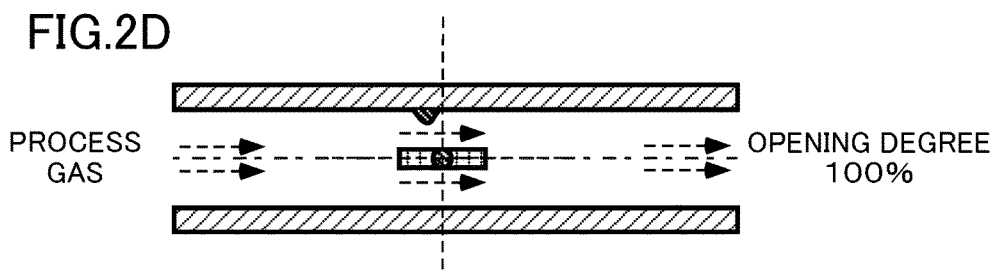

FIG. 2D illustrates a case where the angle formed by the surface 54a of the valving element and the main shaft 52a of the valve box is 0 degrees. In this case, the opening degree of the valve 50 is 100%.

Note that the relationship between the position of the valving element 54 and the opening degree of the valve 50 is not limited to the above-described relationship.

The valving element driver 96 causes the valving element 54 to operate by rotating the valving element 54. An example of the valving element driver 96 is a known stepping motor.

The opening degree sensor 98 detects the position of the valving element 54 (opening degree of the valve 50) by measuring the rotation angle of the valve rod 56. The opening degree sensor 98 includes, for example, a rotary type variable resistor (not illustrated) and a resistance measurement machine for measuring the resistance of the above-described variable resistor. The opening degree sensor 98 measures the rotation angle of the valve rod 56 using the resistance value of the variable resistor.

The closed position storage 72 stores the closed position of the valving element 54. The closed position of the valving element 54 has an initial value (opening degree 0%) being input and is appropriately changed (updated) as described below.

The closed position shifter 74 detects the load on the valving element driver 96 generated in the movement of the valving element 54 to the closed position stored in the closed position storage 72. In a case where the detected load exceeds a predetermined reference value, the closed position shifter 74 shifts the closed position of the valving element 54 stored in the closed position storage 72 on the basis of a correction value. In this case, the correction value may be calculated by the closed position shifter 74, or may be input from the outside by an operator after confirmation on a graphical user interface (GUI) display of the apparatus, for example. Note that the load on the valving element driver 96 may be regularly detected during normal operation in addition to the load in the movement of the valving element 54 to the closed position. Since the load increases when the maintenance period approaches, the maintenance period becomes predictable.

The opening degree controller 76 controls the opening degree of the valve 50 using the valving element driver 96. For example, in a case where the closed position of the valving element 54 is the angle $\theta_1$=90 degrees as illustrated in FIG. 2A, the opening degree of the valve 50 is controlled within the range of 0% to 100%. Moreover, in a case where the closed position of the valving element 54 is shifted (updated) to the angle $\theta_2$ illustrated in FIG. 2B by the closed position shifter 74, the opening degree controller 76 controls the opening degree of the valve 50 within the range of 5% to 100%.

The closed position determiner 78 determines whether the valving element 54 has been set at the closed position stored in the closed position storage 72 within a preset reference value (reference time).

The closed position reference value storage 80 stores the above-described reference value.

Note that the reference value may be a predetermined torque or force used by the valving element driver 96 to drive the valving element 54. The above-described predetermined torque or force can be obtained, for example, by measuring the torque applied to the stepping motor used as the valving element driver 96 using a known torque measurement apparatus, or the like. Alternatively, it is possible to measure the predetermined torque or force as a value of the current flowing through the stepping motor and use the current value as the reference value.

The closed position threshold determiner 82 determines whether maintenance is needed on the basis of a threshold of the closed position calculated from the minimum value of a pressure control range of the reactor 2.

The closed position threshold storage 84 stores the above-described predetermined threshold obtained and input beforehand. It is allowable to store, as the threshold, a value calculated beforehand from the minimum value of the pressure control range of the reactor on the outside or in the valve controller 70.

An example of the valve controller 70 is an electronic circuit. An example of the valve controller 70 is a computer using a combination of hardware such as an arithmetic circuit and software such as a program.

Within the valve controller 70, the closed position shifter 74, the opening degree controller 76, the closed position determiner 78, and the closed position threshold determiner 82 are, for example, electronic circuits.

Within the valve controller 70, the closed position storage 72, the closed position reference value storage 80, and the closed position threshold storage 84 are, for example, storage devices. Examples of the storage device include a semiconductor memory or a hard disk.

The control mechanism 60 controls the film growth apparatus 100. The control mechanism 60 performs, for example, rotation of the wafer W using the rotation mechanism 8, introduction of the process gas from the gas supply port 14 into the reactor 2 using the gas supply mechanism 10, opening and closing of the isolation valve 42, discharging of the process gas using the exhaust 46, the heating of the wafer W using the heater 20. The scrubber 48 detoxify toxic gas and combustible gas discharged from the reactor 2.

An example of the control mechanism 60 is an electronic circuit. An example of the control mechanism 60 is a computer using a combination of hardware such as an arithmetic circuit and software such as a program.

Note that the control mechanism 60 and the valve controller 70 may be configured with hardware such as an electric circuit, a quantum circuit, or with software. In the case of using software for configuration, it is allowable to use a microprocessor mainly using a central processing unit (CPU), a read only memory (ROM) for storing a processing program, a random access memory (RAM) for temporarily storing data, an input/output port, and a communication port. The recording medium is not limited to a detachable one such as a magnetic disk and an optical disk, but may be a fixed type recording medium such as a hard disk device and a memory.

Figure 3:
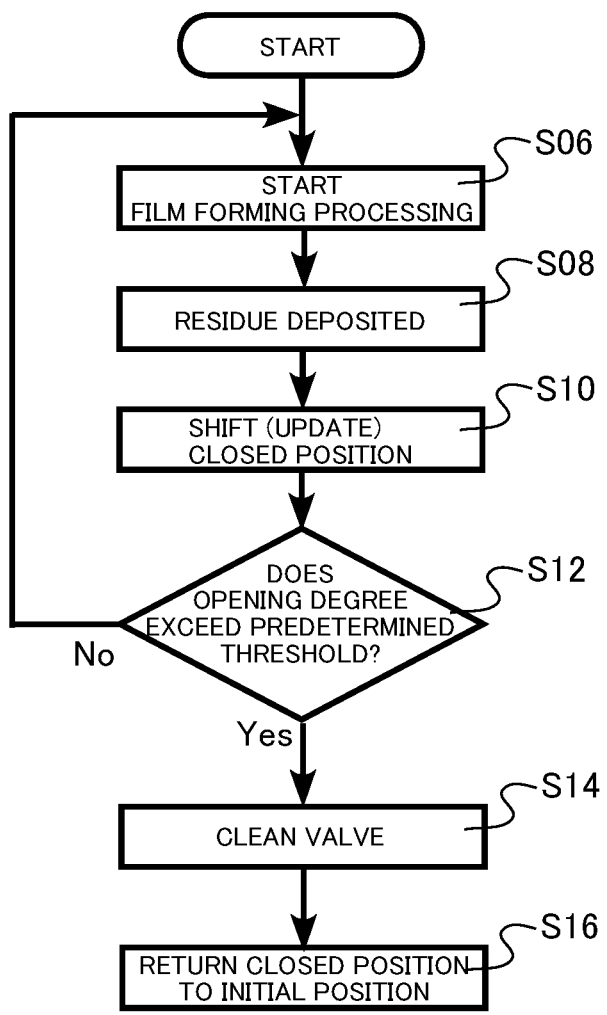
FIG. 3 is a flowchart of a film growth method according to the first embodiment.

The following is film growth processing performed using the film growth apparatus having the above-described configuration. FIG. 3 is a flowchart of the film growth method of the present embodiment.

In the film growth method of the present embodiment, a wafer W to undergo film growth processing is first loaded into the reactor 2, and then film growth processing is started (S06). The control mechanism 60 uses the rotation mechanism 8 to rotate the wafer W mounted on the supporter 12. Moreover, the control mechanism 60 heats the wafer W using the heater 20. Moreover, the control mechanism 60 introduces the process gas into the reactor 2 from the gas supply port 14 at a predetermined flow rate using the gas supply mechanism 10 in the reactor 2. Excess process gas and reaction byproducts in the reactor 2 are discharged from the exhaust port 16 using the exhaust 46. This sets the pressure inside of the reactor 2 to be a predetermined pressure, and in this state, film growth processing is performed onto the wafer W.

The opening degree controller 76 controls the position of the valving element 54 such that the pressure inside the reactor 2 is a predetermined pressure. The position of the valving element is controlled to be in a range from the closed position of the initial opening degree 0% to the opening degree of 100%. Note that the closed position of the valving element 54 is stored in the closed position storage 72.

During the use of the film growth apparatus 100, reaction byproducts are deposited inside the valve 50 and become the residue Re (S08). for example, as illustrated in FIG. 2A.

In a case where the valving element 54 cannot be set to the closed position within the reference time, the closed position shifter 74 shifts (updates) the closed position stored in the closed position storage 72 so as to increase the opening degree of the valve 50 (S10). For example, in a case where the position of the valving element 54 illustrated in FIG. 2A is the original closed position, the position illustrated in FIG. 2B is stored in the closed position storage 72 as a new closed position of the valving element 54.

Next, the closed position threshold determiner 82 checks whether the opening degree determined by the closed position stored in the closed position storage 72 exceeds a threshold stored in the closed position threshold storage 84 (S12). In a case where it exceeds the threshold, the valve 50 is cleaned and the residue Re inside the valve 50 is removed (S14). Next, the closed position shifter 74 returns the closed position to the initial position (S16).

In contrast, in a case where it does not exceed the predetermined threshold, a new wafer W to undergo film growth is loaded in the reactor 2 again and the film growth processing is started (S06).

According to the film growth apparatus 100 of the present embodiment, it is possible to allow the valving element 54 to operate within a range in which the biting of the residue Re would not cause a problem. This enables continuous use of the valve 50 regardless of the small amount of residue Re being deposited, making it possible to reduce the number of times of cleaning the valve 50. This makes it possible to provide a film growth apparatus with high availability.

Moreover, since determination is performed on the basis of a closed position threshold in a case where the opening degree of the valve 50 at the closed position is increased by the residue Re, it is possible to suppress an increase in pressure fluctuation in the reactor 2.

Moreover, it is possible to reduce the number of times of cleaning the valve 50 even in a case where the exhaust of a plurality of reactors is unified, and in particular, it would be possible to enhance safety in a case of using a gas containing arsenic (As) having strong toxicity or a gas containing phosphorus (P) having high flammability.

According to the film growth apparatus 100 of the present embodiment, it is possible to provide a film growth apparatus and a film growth method with high availability.

Second Embodiment

The film growth apparatus according to the present embodiment is different from the film growth apparatus of the first embodiment in that the valve 50 is a needle valve. Herein, description overlapping with the first embodiment will be omitted.

Figure 4A:
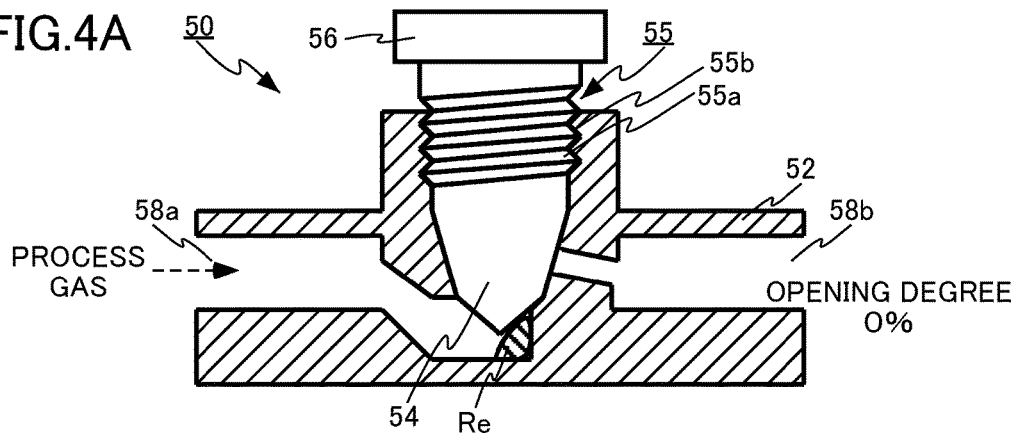
FIGS. 4A to 4C are schematic diagrams illustrating relationships between an opening degree of a valve and a valving element according to a second embodiment.
Figure 4B:
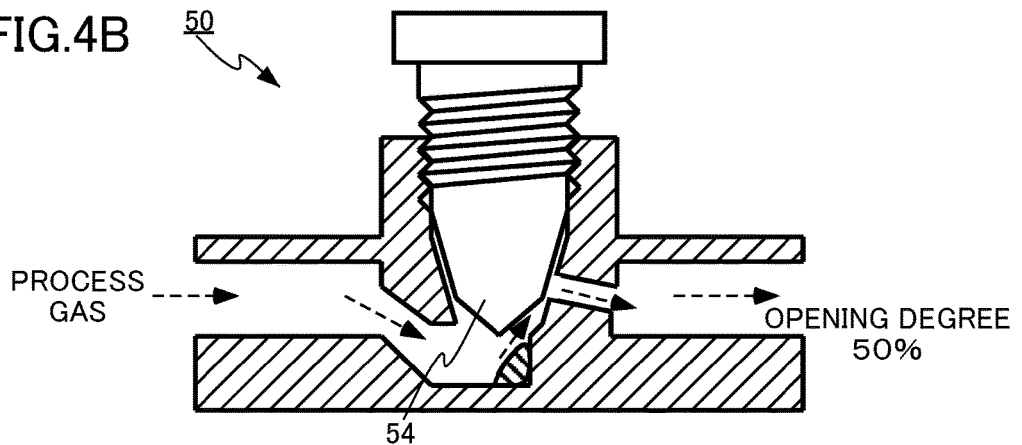
Figure 4C:
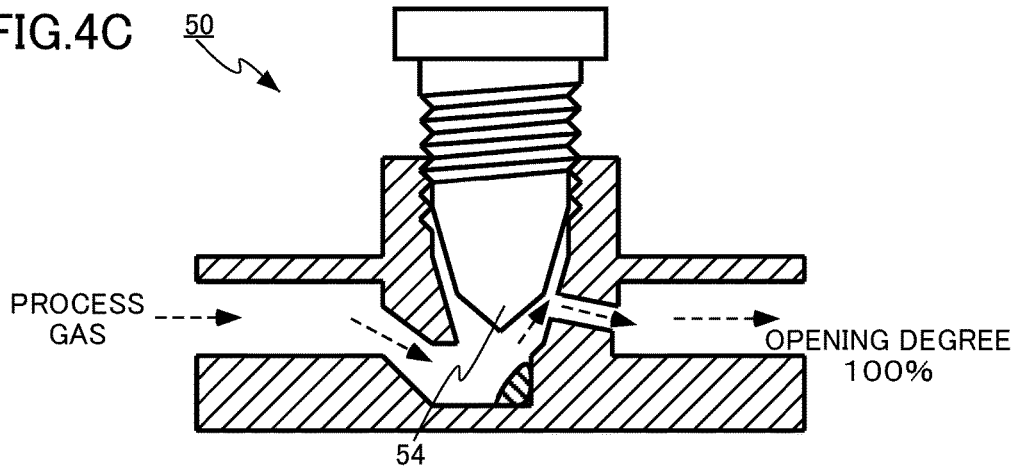

FIGS. 4A to 4C are schematic diagrams illustrating relationships between the opening degree of the valve 50 and the valving element 54 in the present embodiment. The valve 50 includes the valve box 52, the valving element 54, a screw portion 55, and the valve rod 56. The valving element 54 is a needle of the needle valve.

The isolation valve 42 is connected to the inlet port 58$a$, and the exhaust 46 is connected to the outlet port 58$b$.

The screw portion 55 includes a pair of bolts 55$a$ and a nut 55$b$. The nut 55$b$ is provided in a portion of the valve box 52. The valving element 54 is connected to the bolt 55$a$. Moreover, the bolt 55$a$ is connected to the valve rod 56. The valving element 54 is vertically driven by vertical operation of the valve rod 56 or the bolt 55$a$. With this operation, the opening degree of the valve 50 can be controlled.

FIG. 4A is an exemplary case where the opening degree of the valve 50 is 0%. An exemplary initial closed position of the valving element 54 in the use of the film growth apparatus 100 is the position illustrated in FIG. 4A.

In FIG. 4B, the valving element 54 is disposed at an upper position compared with the case of FIG. 4A. FIG. 4B is an exemplary case where the opening degree of the valve 50 is 50%.

In FIG. 4C, the valving element 54 is disposed at a further upper position compared with the case of FIG. 4B. FIG. 4C illustrates an exemplary case where the opening degree of the valve 50 is 100%.

Note that the relationship between the position of the valving element 54 and the opening degree of the valve 50 is not limited to the above-described relationship.

It is also possible to provide a film growth apparatus and a film growth method with high availability even in the film growth apparatus of the present embodiment.

Third Embodiment

The film growth apparatus of the present embodiment is different from the film growth apparatus of the first or second embodiment in that the valve controller 70 further includes a stop time detector and a control pattern storage. Herein, description overlapping with the first or second embodiment will be omitted.

FIG. 5 is a schematic diagram of a film growth apparatus 200 according to the present embodiment.

The stop time detector 88 detects that the control of the position of the valving element 54 (opening degree of the valve 50) has stopped for a predetermined time.

The control pattern storage 92 stores a predetermined operation pattern for controlling the position of the valving element 54 (opening degree of the valve 50) after a stop for a predetermined time. An example of the control pattern storage 92 is a storage device. Examples of the storage device include a semiconductor memory or a hard disk.

An example of the stop time detector 88 in the valve controller 70 is an electronic circuit.

Figure 6A:
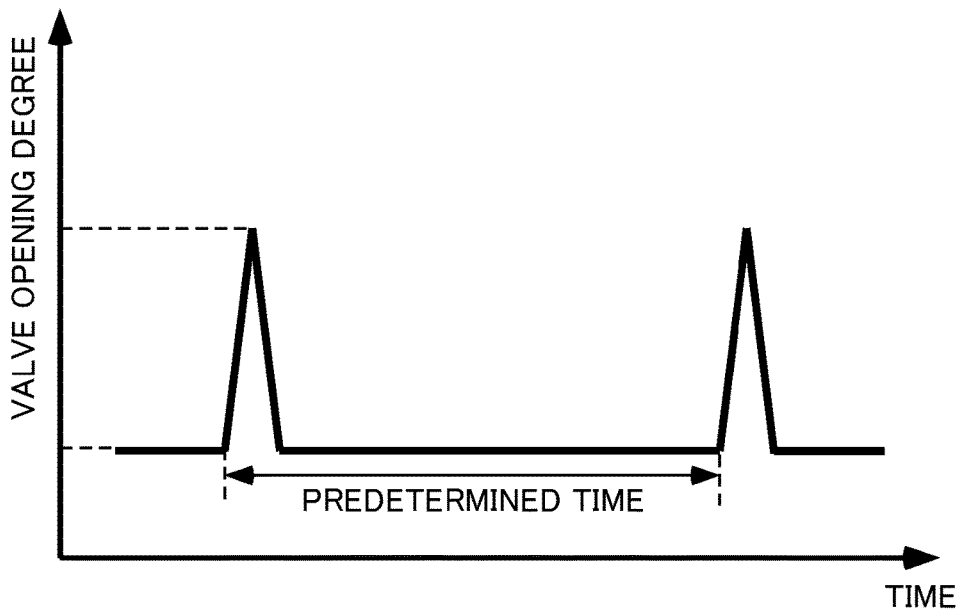
FIGS. 6A and 6B are examples of predetermined control patterns for controlling the opening degree of the valve according to the third embodiment.
Figure 6B:
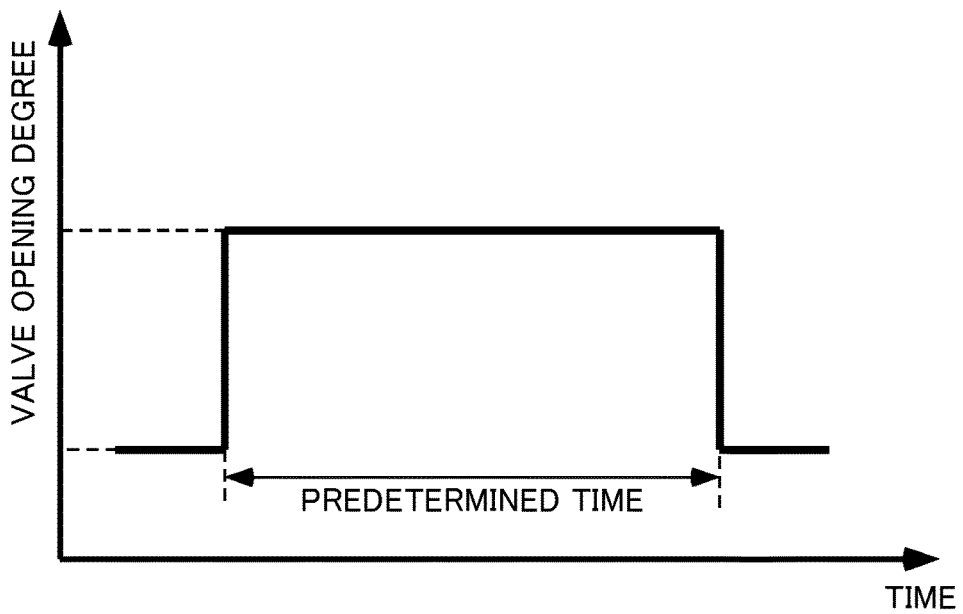

FIGS. 6A and 6B are exemplary predetermined control patterns for controlling the opening degree of the valve 50 in the film growth apparatus 200 of the present embodiment. The control pattern illustrated in FIG. 6A illustrates a case of controlling the opening degree of the valve 50 from 30% to 50% at every passage of a predetermined standby time, and controlling the opening degree of the valve 50 to 30% immediately after that. The control pattern illustrated in FIG. 6B illustrates a case of controlling the opening degree of the valve 50 from 30% to 50% after the passage of a predetermined standby time, and controlling the opening degree of the valve 50 to 30% after further passing of a predetermined standby time. The control pattern in the film growth apparatus 200 of the present embodiment is not limited to this.

Figure 7:
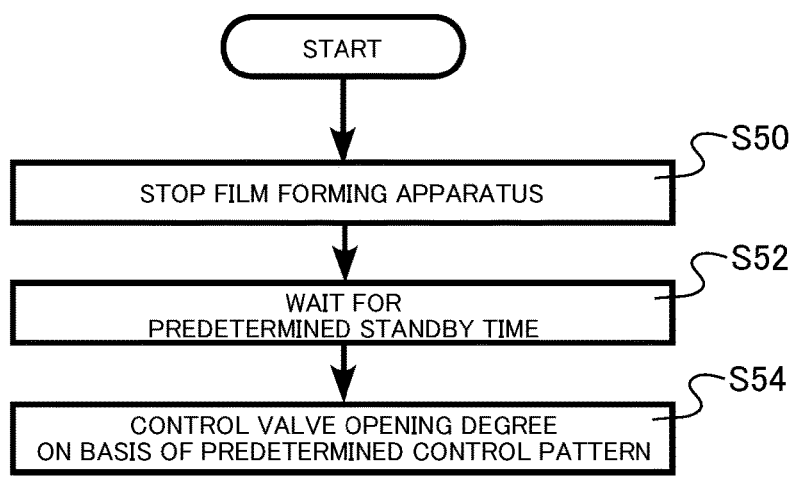
FIG. 7 is a flowchart of the film growth method according to the third embodiment.

FIG. 7 is a flowchart of a method for maintaining the film growth apparatus of the present embodiment.

First, the control mechanism 60 stops the film growth apparatus 200 (S50). The control mechanism 60 stops the rotation mechanism 8, the heater 20, the gas supply mechanism 10, and the exhaust 46. Moreover, the control mechanism 60 closes the isolation valve 42.

Next, the stop time detector 88 detects that a predetermined stop time has elapsed (S52).

Next, the opening degree controller 76 controls the position of the valving element 54 by causing the valving element 54 to operate on the basis of a predetermined operation pattern (S54).

According to the film growth apparatus 200 of the present embodiment, in a case where the stopping of the control of the position of the valving element 54 for a predetermined time is detected, the opening degree of the valve 50 is controlled on the basis of the predetermined operation pattern. With this configuration, the opening degree of the valve 50 is controlled before the residue Re solidifies, making it possible to prevent the loss of control of the opening degree of the valve 50 due to the residue Re. This makes it possible to provide a film growth apparatus and a film growth method with higher availability.

Hereinabove, the embodiments has been described with reference to specific examples. The present invention, however, is not limited to these specific examples.

While descriptions of portions, or the like, not directly necessary for explanation of the present invention, such as apparatus configuration and control method, are omitted, it is possible to appropriately select and use necessary apparatus configuration and control method.

All the film growth apparatuses and film growth methods that include the elements of the present invention and that can be appropriately changed in design by those skilled in the art are included in the scope of the present invention.

What is claimed is:

1. A film growth apparatus comprising:
   a reactor configured to perform film growth processing on a substrate;
   an exhaust configured to discharge an exhaust gas from the reactor to the outside;
   a first valve including a valving element, the first valve provided in a pipe connecting the reactor with the exhaust and configured to control a pressure of the reactor by a position of the valving element;
   a valving element driver configured to cause the valving element to operate; and
   a valve controller including a closed position storage configured to store a closed position of the valving element, an opening degree controller configured to control the position of the valving element operated by the valving element driver, and a closed position shifter configured to detect a load of the valving element driver and shift the closed position in a case where the load exceeds a predetermined reference value, the load generated by controlling the position of the valving element to the stored closed position of the valving element.

2. The film growth apparatus according to claim 1, wherein the valve controller further includes a closed position threshold determiner configured to determine whether maintenance is needed on the basis of a threshold of the closed position calculated from a minimum value of a pressure control range of the reactor.

3. The film growth apparatus according to claim 2, wherein the valve controller further includes a closed position threshold storage configured to store the threshold of the closed position.

4. The film growth apparatus according to claim 1, wherein the valve controller causes the valving element to operate at a predetermined time interval upon detecting that the operation of the valving element has stopped for a predetermined time.

5. The film growth apparatus according to claim 1, wherein the valve controller causes the valving element to operate at a predetermined time interval while pressure control of the reactor is not performed.

6. The film growth apparatus according to claim 1, wherein the first valve further includes a valve box and a valve rod, the valving element provided in the valve box, and the valve rod having one end connected to the valving element and the other end provided outside the valve box.

7. The film growth apparatus according to claim 6, further comprising an opening degree sensor configured to detect the position of the valving element by measuring a rotation angle of the valve rod.

8. The film growth apparatus according to claim 1, wherein the first valve is a butterfly valve.

9. The film growth apparatus according to claim 1, wherein the first valve is a needle valve.

10. The film growth apparatus according to claim 1, wherein the valve controller further includes a closed position determiner configured to determine whether the valving element has been set at the closed position within a predetermined reference value.

11. The film growth apparatus according to claim 1, wherein the valve controller further includes a closed position reference value storage configured to store the predetermined reference value.

12. The film growth apparatus according to claim 1, further comprising a second valve provided between the reactor and the first valve in the pipe.

13. The film growth apparatus according to claim 12, wherein the second valve is a ball valve.

* * * * *